United States Patent
Diep et al.

(10) Patent No.: US 8,844,793 B2
(45) Date of Patent: Sep. 30, 2014

(54) REDUCING FORMATION OF OXIDE ON SOLDER

(75) Inventors: Buu Diep, Murphy, TX (US); Thomas A. Kocian, Dallas, TX (US); Roland W. Gooch, Dallas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/231,749

(22) Filed: Sep. 13, 2011

(65) Prior Publication Data

US 2012/0111925 A1    May 10, 2012

Related U.S. Application Data

(60) Provisional application No. 61/410,454, filed on Nov. 5, 2010.

(51) Int. Cl.
| | |
|---|---|
| B23K 37/00 | (2006.01) |
| H01L 21/67 | (2006.01) |
| H01L 23/00 | (2006.01) |
| B23K 3/047 | (2006.01) |
| B23K 1/20 | (2006.01) |
| B23K 1/008 | (2006.01) |
| B23K 1/00 | (2006.01) |
| B23K 3/08 | (2006.01) |

(52) U.S. Cl.
CPC ... H01L 21/67173 (2013.01); *H01L 2224/7501* (2013.01); *H01L 2224/32145* (2013.01);
(Continued)

(58) Field of Classification Search
USPC ........................................................ 228/178
See application file for complete search history.

(56) References Cited

U.S. PATENT DOCUMENTS

| | | | | |
|---|---|---|---|---|
| 5,223,691 A | * | 6/1993 | Frei et al. | 219/121.46 |
| 5,433,371 A | * | 7/1995 | Morisako | 228/180.5 |

(Continued)

FOREIGN PATENT DOCUMENTS

| | | |
|---|---|---|
| JP | 63-293952 | 11/1988 |
| JP | 04-311044 A * | 4/1991 |

(Continued)

OTHER PUBLICATIONS

Langlois, Richard N., "*Competition through Institutional Form: the Case of Cluster Tool Standards*", Department of Economics Working Paper Series, University of Connecticut, http://digitalcommons.uconn.edu/econ_wpapers/200410, 42 pages, May 1, 2004.

(Continued)

*Primary Examiner* — Kiley Stoner
(74) *Attorney, Agent, or Firm* — Daly, Crowley, Mofford & Durkee, LLP (57) ABSTRACT

In certain embodiments, a system includes a deposition system and a plasma/bonding system. The deposition system deposits a solder outwardly from a substrate of a number of substrates. The plasma/bonding system comprises a plasma system configured to plasma clean the substrate and a bonding system configured to bond the substrates. The plasma/bonding system at least reduces reoxidation of the solder. In certain embodiments, a method comprises depositing solder outwardly from a substrate, removing metal oxide from the substrate, and depositing a capping layer outwardly from the substrate to at least reduce reoxidation of the solder.

20 Claims, 6 Drawing Sheets

(52) U.S. Cl.
CPC ..... *H01L 21/67092* (2013.01); *H01L 2924/014* (2013.01); *H01L 2224/83815* (2013.01); *H01L 2224/29144* (2013.01); *H01L 2924/01029* (2013.01); *B23K 2201/40* (2013.01); *H01L 2224/75102* (2013.01); *H01L 24/75* (2013.01); *H01L 2224/83201* (2013.01); *H01L 2224/27826* (2013.01); *H01L 2224/2781* (2013.01); *H01L 2224/94* (2013.01); *H01L 2224/291* (2013.01); *H01L 21/67207* (2013.01); *H01L 24/83* (2013.01); *H01L 2224/83013* (2013.01); *B23K 3/047* (2013.01); *H01L 24/742* (2013.01); *H01L 2224/2745* (2013.01); *H01L 2224/27318* (2013.01); *B23K 1/206* (2013.01); *H01L 2224/2746* (2013.01); *H01L 2224/32225* (2013.01); *B23K 1/008* (2013.01); *H01L 2224/0401* (2013.01); *H01L 24/27* (2013.01); *B23K 1/0016* (2013.01); *H01L 2224/834* (2013.01); *H01L 2224/27334* (2013.01); *H01L 24/29* (2013.01); *H01L 24/94* (2013.01); *H01L 2224/056* (2013.01); *B23K 3/08* (2013.01)
USPC ............... 228/4.1; 228/5.1; 228/6.2; 228/33; 228/42; 228/205

(56) References Cited

U.S. PATENT DOCUMENTS

| | | | | |
|---|---|---|---|---|
| 5,492,265 | A * | 2/1996 | Wandke | 228/205 |
| 5,630,917 | A * | 5/1997 | Guo | 204/192.12 |
| 5,843,239 | A * | 12/1998 | Shrotriya | 134/1.1 |
| 5,972,163 | A * | 10/1999 | Haji | 156/345.54 |
| 8,278,186 | B2 * | 10/2012 | Cha et al. | 438/455 |
| 2001/0032706 | A1 * | 10/2001 | Wensel | 156/345 |
| 2002/0094691 | A1 * | 7/2002 | Yokogawa et al. | 438/710 |
| 2003/0094442 | A1 * | 5/2003 | Barnett | 219/121.46 |
| 2005/0173057 | A1 * | 8/2005 | Suga et al. | 156/273.3 |
| 2006/0085965 | A1 * | 4/2006 | Suga et al. | 29/514 |
| 2006/0177580 | A1 * | 8/2006 | Yamazaki et al. | 427/248.1 |
| 2007/0111471 | A1 * | 5/2007 | Okada | 438/455 |
| 2010/0261332 | A1 * | 10/2010 | Kim et al. | 438/455 |
| 2010/0294435 | A1 * | 11/2010 | Maeda et al. | 156/379.7 |
| 2010/0310791 | A1 * | 12/2010 | Shimazu et al. | 427/579 |
| 2011/0210483 | A1 * | 9/2011 | Itoh et al. | 266/44 |
| 2012/0132522 | A1 * | 5/2012 | Foster et al. | 204/298.11 |
| 2012/0201955 | A1 * | 8/2012 | Yamazaki et al. | 427/66 |
| 2012/0237693 | A1 * | 9/2012 | Jackson et al. | 427/534 |
| 2014/0057459 | A1 * | 2/2014 | Shimazu et al. | 438/792 |

FOREIGN PATENT DOCUMENTS

| | | | |
|---|---|---|---|
| JP | 11-163036 | | 6/1999 |
| JP | 2000-156456 | A * | 6/2000 |
| JP | 2002-050651 | | 2/2002 |
| JP | 2003-318220 | | 11/2003 |
| JP | 2005-268766 | A * | 9/2005 |
| JP | 2007-027346 | | 2/2007 |
| JP | 2007-281166 | A * | 10/2007 |
| JP | 2008-007348 | A * | 1/2008 |
| JP | 2009-105254 | | 5/2009 |
| SU | 1177097 | A * | 9/1985 |

OTHER PUBLICATIONS

"*Wafer Bonding Machines & Services*", Applied Microengineering Ltd., Wafer Bonding service and aligned bonding machines, http://www.aml.co.uk/index.htm, 1 page.

"*Solder Jetting & Rework, SB²-Jet*", Pac Tech—Packaging Technologies, http://www.pactech.de/index.php?option=com_content&view=article&id=16&Itemid=6; 1 page.

"*Used MRC 603-11*", Bid-Service LLC, http://www.bidservice.com/_browses/_DHTML_PHOTOS.ASP?ProductID=12498&Mfg=M, 2 pages.

"*Used MRC Equipment in Stock*", Used MRC Equipment for Sale, Bid-Service, LLC, http://www.bidservice.com/browses/AlphaBrowses/DHTML_manufacturer.asp?mfg=MRC, 1 page.

"*AML-AWB Platform*", Aligner Wafer Bonders, Applied Microengineering Ltd. (AML), http://www.aml.co.uk, 6 pages.

"*EVG® 500 Series Wafer Bonding Systems*", EVGroup, www.evgroup.com/docs/_brochures/evg500series, 8 pages.

Response filed with the INPI, Application No. 11 59998, filed Apr. 18, 2012, 9 pages.

Office Action from the INPI dated Feb. 21, 2012, Application No. 11 59998 with English Translation, 5 pages.

Japanese Patent Application No. 2011-238431 Office Action dated Feb. 18, 2014, including English translation, 6 pages.

* cited by examiner

REDUCING FORMATION OF OXIDE ON SOLDER

RELATED APPLICATION

This application claims benefit under 35 U.S.C. .sctn.119(e) of U.S. Provisional Application Ser. No. 61/410,454, entitled "Plasma Removal of Metal Oxide," filed Nov. 5, 2010, by Buu Diep et al., which is incorporated herein by reference.

BACKGROUND

In the electronics packaging industry, plasma cleaning with a gas mixture (such as an H2 mixture) may be performed to remove oxide formation.

SUMMARY OF THE DISCLOSURE

In accordance with the present invention, disadvantages and problems associated with previous techniques for reducing formation of metal oxides on solder may be reduced or eliminated.

In certain embodiments, a system includes a deposition system and a plasma/bonding system. The deposition system deposits a solder outwardly from a substrate of a number of substrates. The plasma/bonding system comprises a plasma system configured to plasma clean the substrate and a bonding system configured to bond the substrates. The plasma/bonding system at least reduces reoxidation of the solder.

In certain embodiments, a method comprises depositing solder outwardly from a substrate, removing metal oxide from the substrate, and depositing a capping layer outwardly from the substrate to at least reduce reoxidation of the solder.

Certain embodiments of the invention may provide one or more technical advantages. A technical advantage of one embodiment may be that a plasma/bonding system may be used to at least reduce (or even prevent) formation of metal oxide. The system may plasma clean and then bond wafers without exposing the wafers to oxygen, which may at least reduce formation of metal oxide. A technical advantage of one embodiment may be that a capping layer may protect a wafer from exposure to oxygen, which may reduce formation of metal oxide.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 9 of the drawings, like numerals being used for like and corresponding parts of the various drawings.

Figure 1:
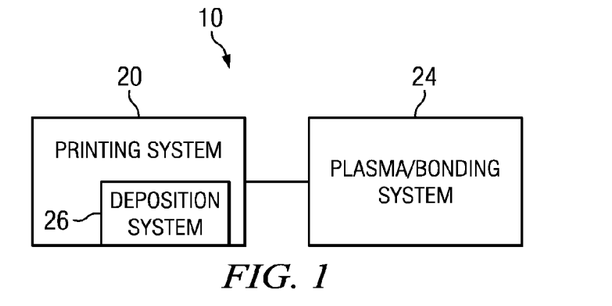
FIG. 1 illustrates an example of a system that may at least reduce reformation of metal oxides on a substrate.

FIG. 1 illustrates an example of a system 10 that may at least reduce reformation of metal oxides on a substrate. System 10 may have one or more chambers designed to reduce reformation or may apply a capping layer that reduces reformation.

Certain solders, such as Au80Sn20 solder, oxidize in air and form a metal oxide (such as Sn oxide). The presence of oxides can cause problems that may prevent formation of a good bond line. For example, the oxides may yield formation of voids that are susceptible to long term joint reliability problems such as hermeticity and/or joint failure, or may cause de-wetting of the solder during the bonding process. These problems can lead to yield loss or reliability problems.

Plasma clean with a gas mixture (such as an H2 mixture) may be performed to remove oxide formation. Oxide, however, may re-form as soon as the cleaned part is exposed to air. For example, for wafer level bonding using jetted solder (e.g., using jetted Au80Sn20 solder), Sn is readily oxidized in air after the solder is jetted, forming tin oxide.

As discussed further herein, certain embodiments may prevent re-formation of metal oxides (such as Sn oxides) in solder (such as Au80Sn20 solder) based bonding (such as wafer level bonding) of substrates during a wafer level packaging process. The substrates may have any suitable application, such as MEMS devices or IR detectors.

In certain embodiments, system 10 may operate on a substrate, such as a wafer. A wafer may be a thin slice of semiconductor material, such as silicon crystal. A wafer may be used in the fabrication of integrated circuits and other microdevices, and may serve as the substrate for microelectronic devices disposed within and outwardly from the wafer. Substrates may have any suitable application, such as microelectromechanical systems (MEMS) devices or infrared (IR) detectors. For example, a first substrate with a base metal stack (such as a Ti/Pt/Au metal stack, which can in certain embodiments be on a lid) and a second substrate with MEMS may be bonded together with solder.

In the illustrated example of FIG. 1, system 10 comprises a printing system 20 (with a deposition system 26) and a plasma/bonding system 24. Deposition system 26 deposits a solder outwardly from at least one substrate of one or more substrates. Plasma/bonding system 24 comprises a plasma system and a bonding system. The plasma system plasma cleans at least one substrate, and the bonding system bonds substrates. Plasma/bonding system 24 at least reduces reformation of metal oxide on the solder (or reoxidation of the solder). Printing system 20 and plasma/bonding system 24 may be separated into distinct systems that each perform its own operations or may be combined into one system that performs one or more operations of both systems.

Printing system 20 may deposit solder on a substrate. In certain embodiments, printing system 20 may include a deposition system 26. Deposition system 26 deposits a solder outwardly from a substrate in any suitable manner. For example, solder may be deposited by solder-jetting. As another example, a solder preform, a specially designed shape of solder, may be used. Other example techniques include physical vapor deposition and plating. If preform or jetting is used, as soon as air exposure occurs, Sn from AuSn solder may be oxidized. In certain embodiments, tin oxide on the AuSn solder may be decreased or removed before bonding (or joining) of the substrates.

Solder comprises a fusible metal alloy with a melting point in the range of 90 to 450 degree Celsius (190 to 840.degree. F.) (such as 180 and 190.degree. C. (360 and 370.degree. F.)) that may be melted to join metallic surfaces. Solder may comprise any suitable combination of any suitable metals. Examples of metals include tin, lead, copper, silver, bismuth, indium, zinc, antimony, and traces of other metals. In certain examples, solder may comprise a gold-tin alloy, such as Au80Sn20.

In certain embodiments, printing system 20 may first form a pattern of photoresist that indicates areas to apply solder on a substrate. Deposition system 26 may then deposit solder as indicated by the areas.

Plasma/bonding system 24 plasma cleans substrates and bonds substrates together. Plasma/bonding system 24 may plasma clean in any suitable manner. In certain embodiments, plasma cleaning cleans substrates with an energetic plasma created from gas. Any suitable gas may be used, such as a gas comprising one or more of the following: hydrogen, nitrogen, argon, helium, or air. The plasma may be created by using high frequency voltages to ionize the low pressure gas. In the plasma, gas atoms are excited to higher energy states and ionized. The plasma activated atoms and ions behave like a molecular sandblast and break down organic contaminants. The contaminants are vaporized and removed.

Plasma/bonding system 24 may bond substrates in any suitable manner. In certain embodiments, plasma/bonding system 24 may align the substrates, one or more of which may have solder deposited on it. Plasma bonding system 24 may then apply pressure to one or more of the substrates to bond the substrates together.

Plasma/bonding system 24 at least reduces (and may even prevent) reformation of metal oxide on a substrate in any suitable manner. In certain embodiments, plasma/bonding system 24 may have one or more chambers designed to reduce exposure of the substrate to oxygen. A chamber may be an enclosure from which one or more gasses have been removed. For example, a chamber may be a vacuum chamber with a low pressure, such as less than or 10 to 20 pascal (Pa). As another example, a chamber may use one gas to push out another gas. For example, a nitrogen chamber may use nitrogen gas to push out oxygen gas to yield a low concentration of oxygen, such as less than 1 parts per million (ppm).

A chamber may have one or more ports, covered with vacuum flanges, to allow instruments or windows to be installed in the walls of the chamber. The chambers may be arranged in any suitable manner. Examples of plasma/bonding systems 24 are described in more detail with reference to FIGS. 2A through 2C.

Figure 2A:
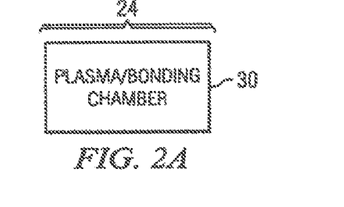
FIGS. 2A through 2C illustrate examples of one or more chambers that may reduce reformation of metal oxides on a substrate.

FIG. 2A illustrates an example of plasma/bonding system 24 that comprises a plasma/bonding chamber 30. Substrates are plasma cleaned and bonded in plasma/bonding chamber 30 such that the solder is not exposed to air after metal oxide removal and prior to bonding. For example, a plasma system may be integrated with a bonding system in plasma/bonding chamber 30. In certain embodiments, the plasma/bonding chamber system 24 comprises a chamber in which the at least one substrate is plasma cleaned and the one or more substrates are bonded. In these certain embodiments, the plasma capability may be integrated with the bonding chamber so that after metal oxide removal, the solder does not get exposed to air again prior to bonding.

Figure 2B:
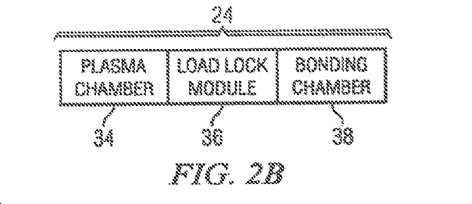

FIG. 2B illustrates an example of plasma/bonding system 24 that comprises a plasma chamber 34, a load-lock module 36, and a bonding chamber 38. A substrate is plasma cleaned in plasma chamber 34, and substrates are bonded in bonding chamber 38. In certain embodiments (e.g., FIG. 5 discussed further below), plasma chamber 34 can be coupled to bonding chamber 38 via load-lock module 36 configured to couple chambers under a substantial vacuum, so that after plasma clean, the solder stays under vacuum to prevent air exposure. In certain embodiments, plasma chamber 34 can be coupled to bonding chamber 38 under a substantial vacuum without aid of load-lock module 36.

Figure 2C:
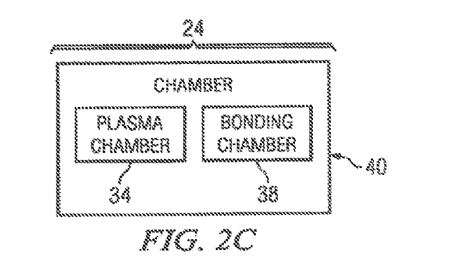

FIG. 2C illustrates an example of plasma/bonding system 24 that comprises a chamber 40. Plasma chamber 34 and bonding chamber 38 are disposed within chamber 40. In certain embodiments, chamber 40 may be a nitrogen chamber configured to use nitrogen gas to push oxygen gas outside of the nitrogen chamber. In certain embodiments, chamber 40 may be a vacuum chamber within which there is a substantial vacuum. In certain embodiments, the bonding tool (with clustered plasma chamber) may be enclosed in N2 atmosphere keeping 02 to very low concentration <<1 ppm) to minimize oxidation.

Figure 6:
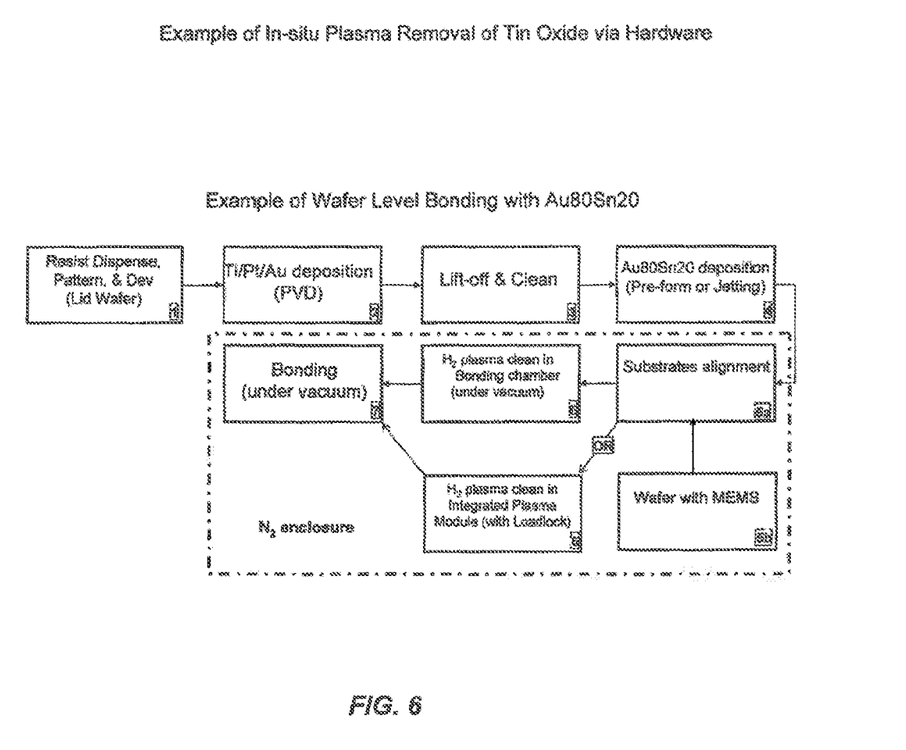
FIG. 6 illustrates a second example of a method for in-situ removal of metal oxide, via hardware.
Figure 8:
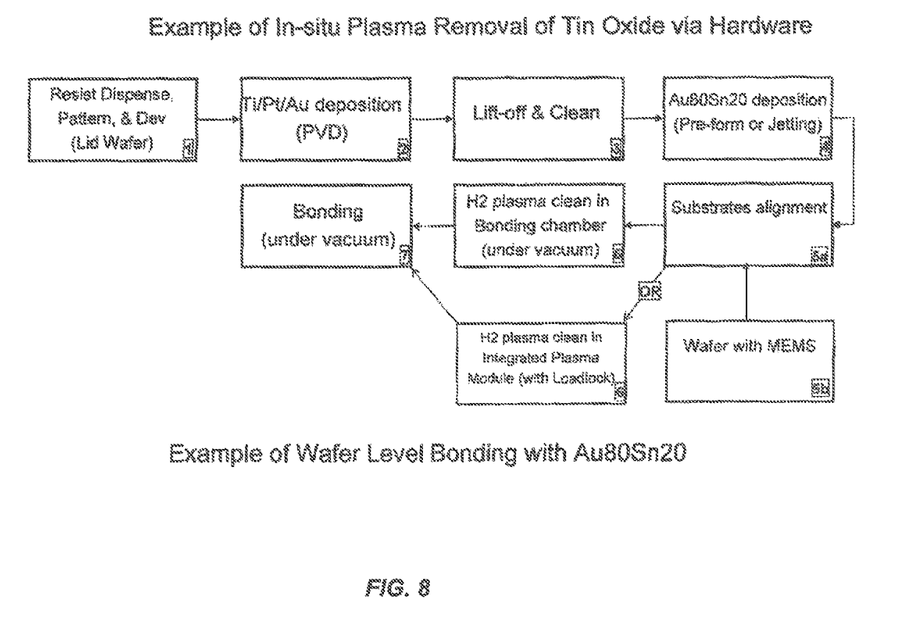
FIG. 8 illustrates a fourth example of in-situ plasma removal of metal oxide, via hardware.

In further examples, FIGS. 6 and 8 each illustrate an example of a method for in-situ removal of metal oxide, via hardware. FIGS. 6 and 8 include similar steps, but the method of FIG. 6 uses hardware that is configured to perform at least the plasma clean and bonding steps within an N2 enclosure, where the plasma clean and bonding steps also each take place under vacuum. In contrast, the method of FIG. 8 includes the same steps as the method of FIG. 6. but without use of the N2 enclosure.

Referring first to FIG. 6, as the example method of FIG. 6 illustrates, plasma clean and bonding, in this embodiment, both take place within the N2 enclosure, and both plasma clean and bonding each take place under vacuum. The example method of FIG. 6 also show that there are two alternative embodiment steps for the plasma cleaning that occurs before bonding under vacuum (block 7): both labeled as block "6": either plasma cleaning in the bonding chamber under vacuum, or plasma cleaning in an integrated plasma module (with Loadlock). In addition, FIG. 6 also shows that, after the solder deposition (block 4), the step before plasma cleaning of aligning the substrate (block 5a) can also comprise use of a wafer with MEMS. As FIG. 6 also illustrates, the plasma cleaning step (block 6) can take place either by plasma cleaning within the bonding chamber under vacuum or by plasma cleaning in an integrated plasma module that is coupled to the bonding via loadlock).

Referring briefly to FIG. 8, the similarly numbered blocks perform the same functions as those described above in connection with FIG. 6, except, as noted above, the steps in blocks 5a through 7 do not take place within an N2 enclosure.

In certain embodiments, plasma/bonding system 24 of FIG. 1 may use a capping layer to reduce reformation of metal oxide on a substrate. System 10 (for example, printing system 20 and/or plasma/bonding system 24) may then plasma clean the substrate and then apply a capping layer resistant to oxidation to the substrate. System 10 may then etch and clean the substrate. Illustrative examples of these embodiments are described in more detail with reference to FIGS. 3 and 7.

Figure 3:
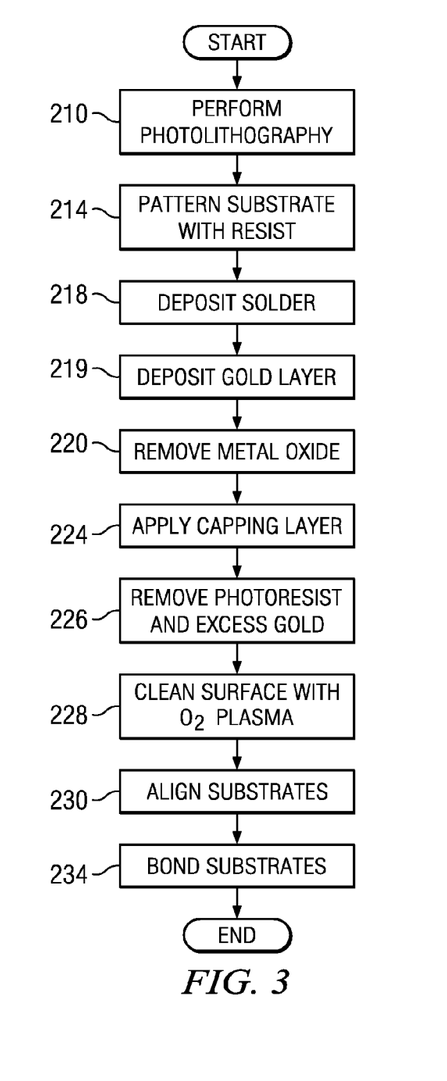
FIG. 3 illustrates an example of a method that may reduce reformation of metal oxides on a substrate.
Figure 7:
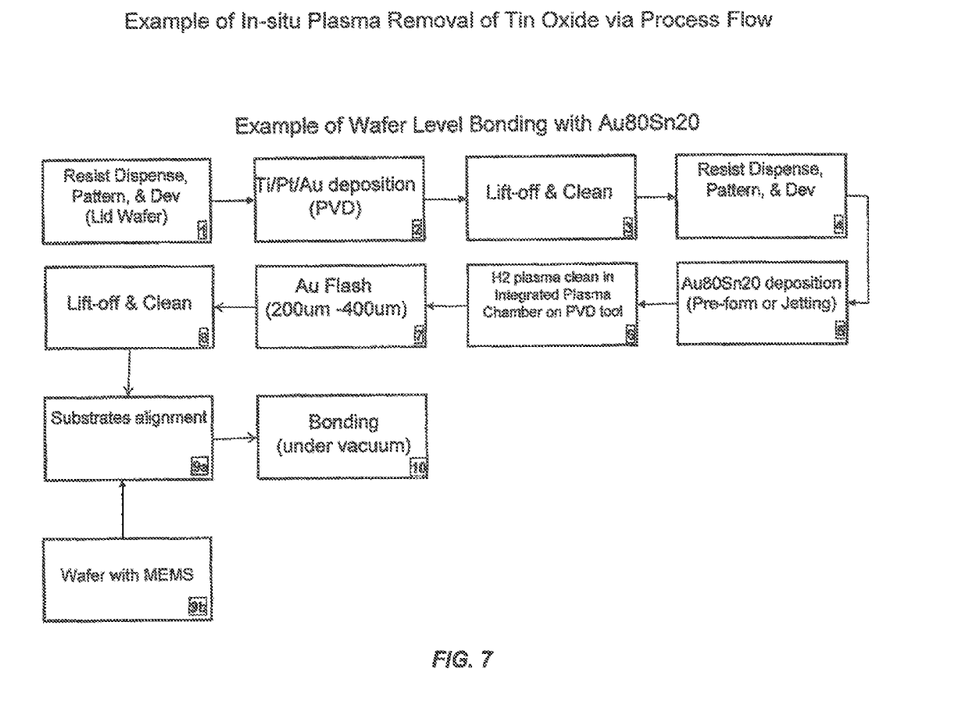
FIG. 7 illustrates a third example of a method for in-situ plasma removal of metal oxide, via process flow.

FIG. 3 illustrates an example of a method that may reduce reformation of metal oxides on a substrate, which method includes a capping step. In addition, FIG. 7 illustrates an examplary method of in-situ plasma removal of metal oxide via process flow that includes a capping step (block 7). In certain embodiments, a method comprises depositing solder outwardly from a substrate, removing metal oxide from the substrate, and flashing a capping layer outwardly from the substrate.

Referring now to FIG. 3, the method starts at step 210, where photolithography may be performed on the substrate to yield a patterned metal layer on the substrate. The substrate may be patterned with photoresist at step 214. The photoresist pattern may indicate areas where solder should be placed. For example, solder may be placed in areas around a sealed area.

Solder is deposited outwardly from the substrate at step 218. A gold layer is depositing outwardly from the substrate at step 219. The solder may be deposited by deposition system 26 in areas indicated by the photoresist pattern. The metal oxide is removed from the substrate at step 220. The metal oxide may be removed in any suitable manner, for example, by plasma cleaning or sputter etch. For example, the surface of the solder may be bombarded by energetic ions to removes all or substantially all of the oxide from the solder.

A capping layer is applied outwardly from the substrate at step 224. The capping layer may comprise a capping material that is resistant to oxidation, such as gold. Applying the capping layer right after removal of the metal oxide and prior to any exposure of the substrate to oxygen may prevent reformation of metal oxide.

The capping layer may be applied in any suitable manner. For example, physical vapor deposition (PVD) may be used to deposit the capping layer by condensation of a vaporized form of the capping material. PVD uses physical methods, such as plasma sputter bombardment or high temperature vacuum evaporation, to deposit material. In sputter deposition, capping material is sputtered, or ejected, from a source and deposited outwardly from the substrate. In evaporation deposition, capping material is evaporated in a vacuum, which allows the vapor particles to travel directly to the substrate. The vapor particles then condense and are deposited outwardly from the substrate. Another method for applying the capping layer, as shown in block 7 of FIG. 7, is via flashing a layer (e.g., of gold (Au) or other material resistant to oxidation), where the flashed layer, in certain embodiments, has a thickness of between 200 μm and 400 μm)

Referring again to FIG. 3, after the capping layer is applied, the capping layer may protect the substrate from oxidation and substrate may be exposed to the atmosphere. In the final soldering process, the capping layer may be incorporated into the solder at the bond line. In certain embodiments, the composition of the solder may be adjusted to compensate for the gold added to the solder by the gold layer.

Photoresist and excess gold are removed at step 226. The surface is cleaned with $O_2$ plasma at step 228. The substrate is aligned with another substrate at step 230. The substrates are bonded at step 234. The method then ends.

FIG. 7 is an additional example of in-situ plasma removal of metal oxide, via process flow that includes capping (via the Au flash step of block 7). Referring to FIG. 7, in certain embodiments, when the base metal system (such as Ti/Pt/Au) is deposited (block 2), the metals are deposited sequentially under vacuum to prevent oxidation. The last layer is gold (Au), which is resistant to oxidation and serves as protective layer. After the solder is deposited (block 5), the tin oxide on the wafer is removed by 15 either plasma clean or by sputter etch followed by flashing of Au as the capping layer without air breaking. The Au layer may prevent re-oxidation of the oxide.

Figure 4:
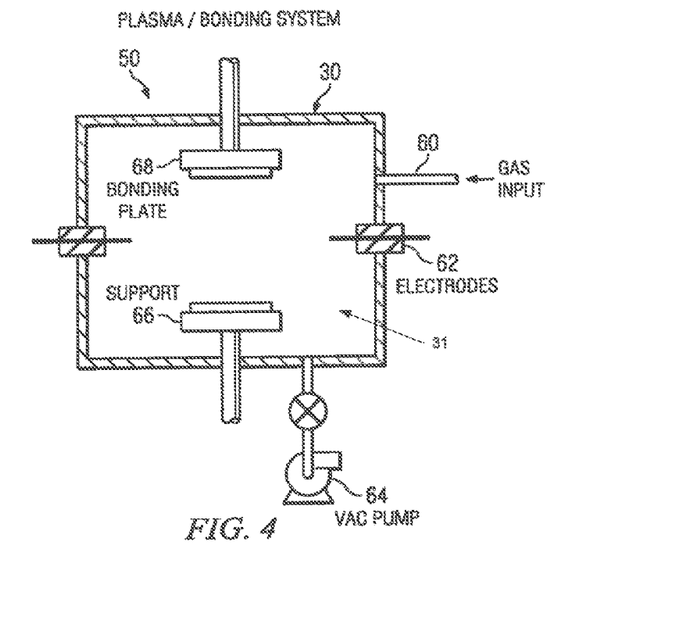
FIG. 4 illustrates an example a chamber that may reduce reformation of metal oxides on a substrate.

FIG. 4 illustrates an example of a chamber 30 of a plasma/bonding system 50 that may reduce reformation of metal oxides on a substrate. In the example, plasma/bonding system 50 comprises a plasma/bonding chamber 30 with a gas input 60 for plasma gas, electrodes 62 for plasma generation, a vacuum pump 64 that creates a vacuum in chamber 30, a support 66 that supports wafers, and a bonding plate 68 that bonds wafers.

Figure 5:
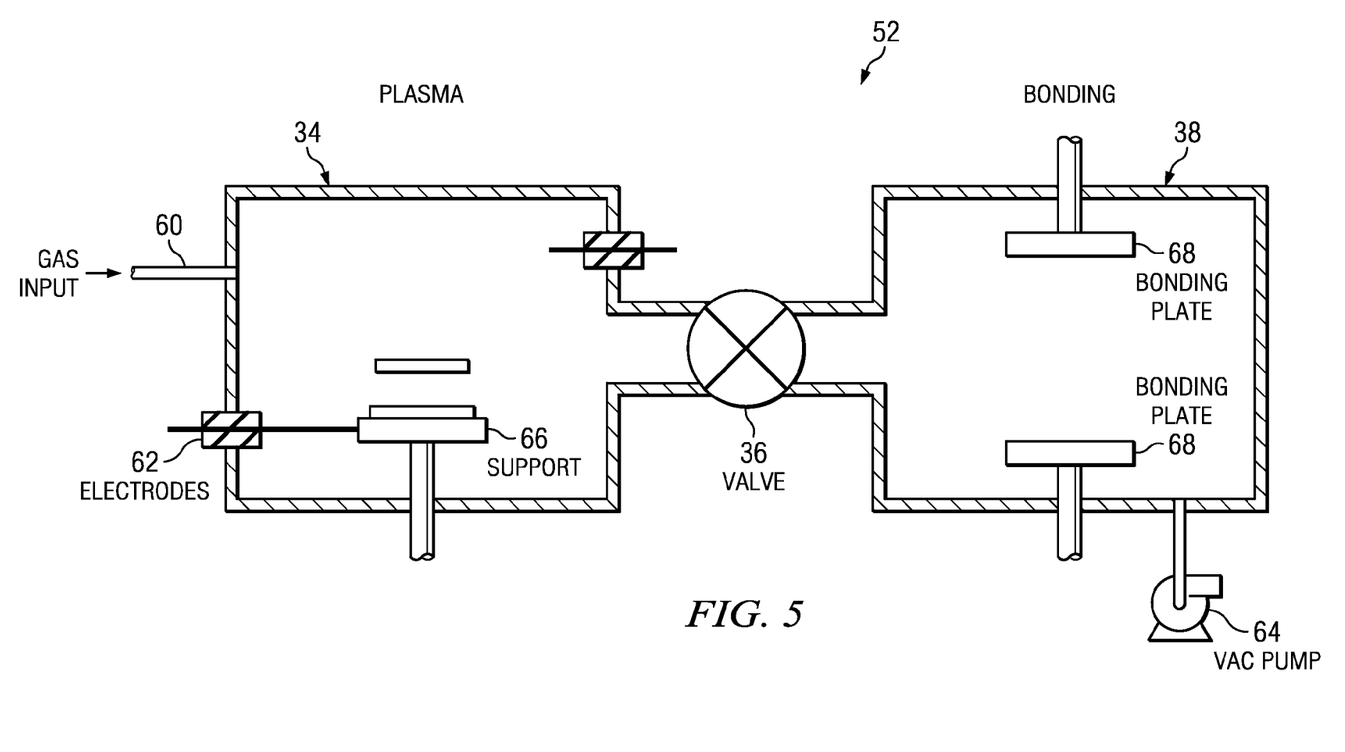
FIG. 5 illustrates an example two chambers that may reduce reformation of metal oxides on a substrate.

FIG. 5 illustrates an example of two chambers 34 and 38 of a plasma/bonding system 52 that may reduce reformation of metal oxides on a substrate. In the example, plasma/bonding system 52 comprises a plasma chamber 34, a load-lock module 36, and a bonding chamber 38. Plasma chamber 34 has gas input 60 for plasma gas, electrodes 62 for plasma generation, and support 66 that supports wafers. Load-lock module 36 comprises a valve. Bonding chamber 38 has bonding plates 68 that bond wafers and vacuum pump 64 that creates a vacuum in chambers 34 and 38. Vacuum pump 64 may be placed in any suitable location of system 52, such as at plasma chamber 34 or load-lock module 36.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A system comprising:
   a first chamber, the first chamber being under vacuum and configured to receive a first substrate for processing, the first chamber housing therein:
   a printing system disposed within the first chamber, the printing system configured to deposit on the first substrate a pattern or shape indicating where solder is to be placed; and
   a deposition system configured to deposit solder, to the pattern or shape, outwardly from the substrate; and
   a plasma/bonding chamber in operable communication with the first chamber, the plasma/bonding chamber comprising a plurality of walls defining an interior space that is substantially sealed from an environment external to the plasma/bonding chamber, wherein the interior space is constructed and arranged for receiving a second substrate and for receiving the first substrate, to be plasma cleaned, capped, and bonded to the second substrate;
   a plasma cleaning system disposed and operating within the interior space of the plasma/bonding chamber, the plasma cleaning system in operable communication with a capping system and a bonding system that are each disposed within and operable within the plasma/bonding chamber, the plasma cleaning system comprising a gas input for receiving at least one plasma gas, at least one electrode for plasma generation, and a vacuum pump to create a vacuum in the plasma/bonding chamber, wherein the plasma cleaning system is configured to plasma clean the first substrate while both the plasma cleaning system and the bonding system are operably coupled to and disposed within the interior space of the plasma/bonding chamber, wherein the plasma cleaning system is constructed and arranged for receiving the first substrate for plasma cleaning of the first substrate, under vacuum, for a first time when the first substrate is received into the plasma bonding chamber and for receiving the first substrate for cleaning a second time, after the first substrate has had a capping layer applied to it;
   a capping layer deposition system disposed and operating within the interior space of the plasma/bonding chamber, the capping layer deposition system in operable communication with the plasma cleaning system and constructed and arranged to deposit a capping layer of a material resistant to oxidation to the first substrate after the first substrate has been processed by the plasma cleaning system; and
   a bonding system disposed and operating within the same interior space of the plasma/bonding chamber in which the plasma cleaning system operates, the bonding system being in operable communication with the capping layer deposition system and comprising a support to support at least a first substrate to be bonded and at least one bonding plate operable to bond the first substrate to the second substrate;
   wherein the bonding system is configured to receive the first substrate after the first substrate has been capped and plasma cleaned a second time and, after the first substrate has been aligned to the second substrate, to bond the first substrate to the second substrate, under vacuum conditions, while the first and second substrates are disposed within the same interior space as the plasma system.

2. The system of claim 1, wherein the vacuum pump is disposed within at least one of the plurality of walls of the plasma/bonding chamber so as to be in operable communication with the interior space of the plasma/bonding chamber, the vacuum pump configured to reduce the concentration of oxygen within the interior space of the plasma/bonding chamber during operation of at least one of the plasma system and the bonding system.

3. A system comprising:
   a plasma/bonding chamber for receiving therein a first substrate to be plasma cleaned, the first substrate comprising a portion of solder formed therein, and for receiving therein a second substrate to be bonded to the first substrate, the plasma/bonding chamber having a plurality of walls defining an interior space, wherein the interior space of the first chamber is substantially sealed from an environment external to the first chamber;
   a plasma cleaning system operably coupled to and disposed within the interior space of the plasma/bonding chamber, the plasma cleaning system comprising a gas input for receiving at least one plasma gas, at least one electrode for plasma generation, and a vacuum pump to create a vacuum in the plasma/bonding chamber, wherein the plasma cleaning system is configured to plasma clean the first substrate so as to at least remove metal oxide from the portion of solder;
   a capping layer deposition system disposed and operating within the interior space of the plasma/bonding chamber, the capping layer deposition system in operable communication with the plasma cleaning system and configured to receive the first substrate from the plasma cleaning system after plasma cleaning is complete, to deposit a capping layer outwardly from the first substrate, and to provide the first substrate to the bonding system when capping is complete, wherein the capping layer deposition system is configured within the plasma/bonding chamber to ensure that the capping layer is applied before any exposure of the first substrate to oxygen and before any bonding of the substrate; and
   a bonding system disposed and operating within the same interior space of the plasma/bonding chamber in which the plasma cleaning system and capping layer deposition system operate, the bonding system in operable communication with the capping layer deposition system and comprising a support to support at least a first substrate to be bonded and at least one bonding plate operable to bond the first substrate to the second substrate;
   wherein the bonding system is configured to receive the first substrate after the first substrate has been capped and plasma cleaned and is configured to bond the first substrate to the second substrate, under vacuum conditions, while the first and second substrates are disposed within the same interior space as the plasma system.

4. The system of claim 3, wherein the system is configured to: allow the first substrate to be exposed to atmosphere after application of the capping layer.

5. The system of claim 3, wherein the capping deposition system comprises at least one of physical vapor deposition (PVD), sputter deposition, and evaporation deposition.

6. The system of claim 3, wherein the capping layer comprises a material resistant to oxidation.

7. The system of claim 3, further comprising a deposition system in operable communication with the first chamber, the deposition system configured to deposit the first portion of solder outwardly from the first substrate.

8. The system of claim 1, wherein the system is configured to allow the first substrate to be exposed to atmosphere after application of the capping layer and prior to the bonding system bonding the first substrate to the second substrate.

9. The system of claim 3, wherein the bonding system is configured to incorporate the capping layer into at least a second portion of solder at a bond line.

10. The system of claim 3, wherein the bonding system is configured for wafer-level bonding of substrates.

11. The system of claim 1, wherein the gas input is operably coupled to and disposed within a first wall of the plurality of walls of the plasma/bonding chamber, wherein the gas input is configured to supply plasma gas from outside the plasma/bonding chamber to the interior space of the plasma/bonding chamber; and further comprising:
 a plurality of electrodes operably coupled to the interior space of the plasma/bonding chamber and configured to generate plasma.

12. The system of claim 1, wherein the arrangement of the plasma cleaning system with the bonding system in the interior space of the plasma/bonding chamber is configured to reduce exposure of solder on the first substrate to oxygen.

13. The system of claim 1, wherein the pump is configured to reduce the pressure within the interior area to less than 20 Pascals (Pa).

14. The system of claim 1, wherein the pump is configured to push in a non-oxygen gas capable of pushing out enough oxygen gas to reduce the concentration of oxygen within the interior space to 1 part per million (ppm) or less.

15. The system of claim 1, wherein the printing system is further configured to deposit a layer of photoresist onto the substrate in the pattern or shape.

16. The system of claim 1, wherein the plasma cleaning system, capping layer deposition system, and bonding system are disposed within an undivided portion of the interior space of the plasma/bonding chamber, wherein the first substrate remains within the undivided portion of the interior space of the plasma/bonding chamber at least from the time that the first substrate is first plasma cleaned until the time the bonding of the first substrate to the second substrate is complete.

17. The system of claim 1, wherein the bonding system is constructed and arranged to apply pressure to at least one of the first and second substrates to bond the first and second substrates together.

18. The system of claim 3, further comprising a first chamber in operable communication with the plasma/bonding chamber, the first chamber being under vacuum and configured to receive the first substrate for processing before the first substrate is processed by the second chamber, the first chamber comprising:
 a printing system disposed within the first chamber, the printing system configured to deposit on the first substrate a pattern or shape indicating where solder is to be placed; and
 a deposition system configured to deposit the portion of solder, to the pattern or shape, outwardly from the substrate.

19. The system of claim 3, wherein the bonding system is constructed and arranged to apply pressure to at least one of the first and second substrates to bond the first and second substrates together.

20. The system of claim 3, wherein the plasma/bonding chamber is constructed and arranged to keep the first substrate within the plasma/bonding chamber, under vacuum conditions, at least from the time the first substrate is plasma cleaned to the time the bonding of the first substrate to the second substrate is complete.

* * * * *